(12) United States Patent
Kanamaru

(10) Patent No.: US 7,461,326 B2
(45) Date of Patent: Dec. 2, 2008

(54) INFORMATION PROCESSING METHOD CAPABLE OF DETECTING REDUNDANT CIRCUITS AND DISPLAYING REDUNDANT CIRCUITS IN THE CIRCUIT DESIGN PROCESS

(75) Inventor: Keisuke Kanamaru, Tokyo (JP)

(73) Assignee: NEC Corporation, Tokyo (JP)

( * ) Notice: Subject to any disclaimer, the term of this patent is extended or adjusted under 35 U.S.C. 154(b) by 474 days.

(21) Appl. No.: 11/174,620

(22) Filed: Jul. 6, 2005

(65) Prior Publication Data
US 2006/0010342 A1    Jan. 12, 2006

(30) Foreign Application Priority Data
Jul. 8, 2004    (JP)    ............... 2004-201868

(51) Int. Cl.
*H03M 13/00*    (2006.01)
(52) U.S. Cl. .............. 714/760; 714/754; 714/769; 714/798
(58) Field of Classification Search ........ 714/760, 714/11, 754, 758, 769, 798, 799; 716/2, 716/3, 18; 711/149
See application file for complete search history.

(56) References Cited

U.S. PATENT DOCUMENTS

| | | | | |
|---|---|---|---|---|
| 5,515,526 | A * | 5/1996 | Okuno | ............... 716/2 |
| 5,706,205 | A * | 1/1998 | Masuda et al. | ............ 716/18 |
| 6,378,050 | B1 * | 4/2002 | Tsuruta et al. | ............ 711/149 |
| 7,200,822 | B1 * | 4/2007 | McElvain | ............ 716/3 |
| 7,234,127 | B2 | 6/2007 | Kanamaru | |
| 2005/0120324 | A1 | 6/2005 | Kanamaru | |

FOREIGN PATENT DOCUMENTS

| | | |
|---|---|---|
| JP | 11-73447 | 3/1999 |
| JP | 11-102386 | 4/1999 |
| JP | 2005-165681 | 6/2005 |

OTHER PUBLICATIONS

Giovanni De Micheli, "Synthesis and Optimization of Digital Cicuits", McGraw-Hill, 1994, pp. 408-409.
L. Stock, et al., "BooleDozer: Logic Synthesis for ASICs", IBM J. Res. Develop. vol. 40, No. 4, Jul. 1996, pp. 407-430.
Japanese Office Action dated Aug. 27, 2008 with Partial English Translation.

* cited by examiner

*Primary Examiner*—Mujtaba K. Chaudry
*Assistant Examiner*—Fritz Alphonse
(74) *Attorney, Agent, or Firm*—McGinn IP Law Group PLLC

(57) ABSTRACT

The information processing method of the present invention detects redundant circuits as described below by means of an information processor that is provided with: a storage unit for storing circuit operation information that uses hardware description language and a library for performing a logic synthesis of the circuit operation information and converting to a net list; and a display unit. The information processor hierarchically arranges statement by statement the circuit operation information that is stored in the storage unit, and then refers to the library, performs a logic synthesis of the circuit operation information that has been hierarchically arranged and converts to a net list. The information processor then detects redundant fault sites, which are sites that are logically redundant from the net list, and displays information showing the redundant circuits that contain the redundant fault sites on the display unit.

16 Claims, 5 Drawing Sheets

FIG.1
(PRIOR ART)

```
module TEST ( ... ) ;
    :
  assign S0 = ~A & ~B ;
  assign S1 = ~A & B ;
  assign S2 = A & ~B ;
  assign S3 = A & B ;

always @(S0 or S1 or S2 or S3)
    casez ({S0, S1, S2, S3})
      4'b1000 : DOUT = 1'b0;
      4'b0100 : DOUT = 1'b0;
      4'b0010 : DOUT = 1'b0;
      4'b0001 : DOUT = 1'b0;
      default : DOUT = 1'b1;
    endcase assign CHECK = DOUT & ECHK ;
    :
endmodule
```

FIG.4

```
module TEST ( ... ) ;
  :
  TEST_S0_5  TEST_S0_5(S0, A, B) ;
  TEST_S1_6  TEST_S1_6(S1, A, B) ;
  TEST_S2_7  TEST_S2_7(S2, A, B) ;
  TEST_S3_8  TEST_S3_8(S3, A, B) ;

TEST_DOUT_10
  TEST_DOUT_10(S0,S1,S2,S3,DOUT);

TEST_CHECK_19
  TEST_CHECK_19(CHECK,DOUT,ECHK);
  :
endmodule
```

FIG.5

```
module TEST_S0_5 (S0, A, B);
input A, B;
output S0;

assign S0 = ~A & ~B;

endmodule module TEST_S1_6 (S1, A, B);
input A, B;
output S1;

assign S1 = ~A & B;

endmodule module TEST_S2_7 (S2, A, B);
input A, B;
output S2;

assign S2 = A & ~B;

endmodule module TEST_S3_8 (S3, A, B);
input A, B;
outpu S3;

assign S3 = A & B;

endmodule
```

```
module TEST_DOUT_10 (S0, S1, S2, S3, DOUT);
input S0, S1, S2, S3;
output DOUT;

always @(S0 or S1 or S2 or S3)
    casez ({S0, S1, S2, S3})
      4'b1000 : DOUT = 1'b0;
      4'b0100 : DOUT = 1'b0;
      4'b0010 : DOUT = 1'b0;
      4'b0001 : DOUT = 1'b0;
      default : DOUT = 1'b1;
    endcase endmodule module TEST_CHECK_19 (CHECK, DOUT, ECHK);
input DOUT, ECHK;
output CHECK;

assign CHECK = DOUT & ECHK;

endmoule
```

US 7,461,326 B2

INFORMATION PROCESSING METHOD CAPABLE OF DETECTING REDUNDANT CIRCUITS AND DISPLAYING REDUNDANT CIRCUITS IN THE CIRCUIT DESIGN PROCESS

BACKGROUND OF THE INVENTION

1. Field of the Invention

The present invention relates to an information processing method and an information processor for detecting redundant circuits from circuit design information, and to a program for causing a computer to execute this method.

2. Description of the Related Art

Application-Specific Integrated Circuits (ASIC) are one type of LSI (Large-Scale Integrated Circuits). To reduce the time required in circuit design for these ASIC, methods have been adopted in which the designer uses hardware description language (HDL) to describe the circuit operations, following which a computer consults a library that has been prepared in advance and produces a net list, which comprises circuit patterns that correspond to the descriptions of the circuit operations. The net list is assembled from cells that indicate configurations on the transistor level, and is substantially equivalent to data that can be copied to an exposure mask for fabricating semiconductors. From the designer's description of circuit operations, a circuit pattern of a fabrication mask is produced by computer, thus affording a major reduction in the time spent in circuit design compared with the prior art.

RTL (Register Transfer Level) is typically used as the circuit operation information for describing circuit operations by means of HDL. A simple explanation of an example of RTL follows below.

FIG. 1 shows an example of RTL description. This example shows a case in which RTL is described by Verilog-HDL. The information of input/output signals is either one of "1" and "0."

FIG. 1 is a 1/n check circuit for checking that the output "1" is the single output for n types of input. In this case, the value of n is 4. In FIG. 1, A and B are assumed to be "0." Since "~X" indicates the negation of X, the "~A" and "~B" on the right side of the first continued assignment statement "assign" are both "~(negation)" and therefore "1." The S0 on the left side is therefore "1," which is the result of the AND of "1" and "1." The left side of the second and following continued assignment statements are "0," and S1=S2=S3=0. Arranging S0-S3 produces "1000." This value corresponds to the first "4' b1000" of the "case" statement, and in this case, "DOUT=1' b0", resulting in the output "0."

In this way, when A and B are applied as input under normal conditions, only one of S0, S1, S2, and S3 gives "1," and the default in the "case" statement is not applied.

On the other hand, when an input signal is not normal due to a single stuck-at fault that occurs in the signal lines of an LSI that has been fabricated, the default within the "case" statement is applied, "1" is produced in DOUT, the check structure of the statement "assign CHECK=DOUT & ECHK" operates, and a signal that indicates the occurrence of a fault is supplied as output in "CHECK." In the following explanation, a single stuck-at fault in which the input signal is fixed at logic value "0" is referred to as a "stuck-at-0 fault," and a single stuck-at fault in which the input signal is fixed at logic value "1" is referred to as a "stuck-at-1 fault."

Thus, a method is adopted for preassembling a redundant circuit that can be represented by the 1/n check circuit that is shown in FIG. 1 and thus increasing reliability. However, because this type of redundant circuit is normally a circuit that cannot exist logically, the possibility exists that logical optimization in the process of converting from RTL to a net list will eliminate redundant circuits. This possibility is illustrated by the example of the 1/n check circuit that is shown in FIG. 1.

From FIG. 1, DOUT=0 under normal conditions, and signal CHECK therefore takes the & (AND) of the numerical value "0" and ECHK. Of the two numerical values for which AND is taken, when one is "0" the value of signal CHECK is "0" regardless of the value of ECHK, and the significance of providing the statement "assign CHECK=DOUT & ECHK" is therefore canceled. This portion is therefore seen as an unnecessary circuit and is eliminated in the optimization.

As described hereinabove, some redundant circuits are provided for the sake of reliability, but others are actually logically redundant and therefore unnecessary. In either case, a redundant fault site that is recognized by a computer as a fault source such as a single stuck-at fault is contained in the RTL description. The reason for the deletion of the redundant fault site in the optimization is as follows.

As a basic optimization method of logic synthesis, for nets that indicate the physical states of connections between gates and modules, optimization is carried out such that a net in which a stuck-at-1 fault cannot be detected is replaced by a 1-clamp and a net in which a stuck-at-0 fault cannot be detected is replaced by a 0-clamp. This method is based on the fact that changing nets in which stuck-at faults cannot be detected to clamps will produce no changes in the operation of the circuit as seen from the outside. These points are described in, for example, *Synthesis and Optimization of Digital Circuits* by Giovanni De Micheli (USA) (McGraw-Hill, 1994. pp. 408-409; hereinbelow referred to as "Document 1").

At the time of optimization, a computer is unable to determine whether a redundant circuit is for the purpose of reliability or simply unnecessary. To prevent the elimination of redundant circuits that are provided for the purpose of reliability, a method is described in, for example Japanese Patent Laid-Open Publication No. 102386/99 in which the designer looks at the RTL in advance and designates the circuits that are to be omitted as objects of the optimization process before the optimization process (hereinbelow referred to as "Document 2").

In the method that is disclosed in Document 2, when there is a multiplicity of redundant circuits that are provided for the purpose of reliability, the designer is faced with the labor-intensive task of carrying out a process of finding all of these redundant circuits from among the RTL before having the computer carry out a logic synthesis if these circuits are to be protected from optimization.

SUMMARY OF THE INVENTION

It is an object of the present invention to provide an information processing method and an information processor that enable the detection of redundant circuits in the process of circuit design and that enable the display of redundant circuits that have been detected, and further, to provide a program for causing a computer to execute this method.

The information processing method of the present invention is a method for detecting redundant circuits by means of an information processor that is provided with: a storage unit for storing circuit operation information in which the operation of circuits is described using a hardware description language and a library for performing a logic synthesis of the circuit operation information and converting to a net list, which is information of circuit patterns; and a display unit; the information processing method comprising steps of: hierarchically arranging statement by statement the circuit operation information that is stored in the storage unit; referring to the library, performing a logic synthesis of the circuit operation information that has been hierarchically arranged, and converting to a net list; detecting redundant fault sites that are sites that are logically redundant from the net list; and displaying on the display unit information that shows the redundant circuits that contain the redundant fault sites.

The information processor of the present invention is a configuration that includes: a storage unit for storing circuit operation information in which the operations of circuits are described using a hardware description language and a library for performing a logic synthesis of the circuit operation information and converting to a net list, which is information of circuit patterns; a display unit for displaying information that shows redundant circuits; and a data processor for hierarchically arranging statement by statement the circuit operation information that is stored in the storage unit, and then referring to the library, performing a logic synthesis of the hierarchically arranged circuit operation information and converting to a net list, detecting redundant fault sites that are logically redundant sites from the net list, and displaying on the display unit information that shows the redundant circuits that include redundant fault sites.

The program of the present invention is a program for causing a computer to detect redundant circuits; the computer being provided with: a storage unit for storing circuit operation information in which the operations of a circuit are described using a hardware description language and a library for performing a logic synthesis of the circuit operation information and converting to a net list, which is information of circuit patterns, and a display unit; the program causing the computer to execute processes including steps of: hierarchically arranging statement by statement the circuit operation information that is stored in the storage unit; referring to the library, performing a logic synthesis of the hierarchically arranged circuit operation information and converting to a net list; detecting redundant fault sites that are sites that are logically redundant from the net list; and displaying on the display unit information that shows redundant circuits that contain redundant fault sites.

In the present invention, the circuit operation information is hierarchically arranged statement by statement, and statements that include redundant circuits are therefore not deleted in the logic synthesis. In addition, redundant circuits that include redundant fault sites are extracted and information showing the redundant circuits is displayed on a display unit. The designer is thus able to specify redundant circuits that should remain for the purpose of reliability based on the information that is supplied to the display unit. In this way, a list of redundant circuits that have been intentionally assembled by the designer can be detected, and redundant circuits that should be protected from optimization can be easily specified.

The above and other objects, features, and advantages of the present invention will become apparent from the following description with reference to the accompanying drawings, which illustrate examples of the present invention.

BRIEF DESCRIPTION OF THE DRAWINGS

FIG. 1 shows an example of RTL description;

FIG. 4 is a list showing the lower hierarchy of the RTL shown in FIG. 1; and

FIG. 5 is a list showing the lower hierarchy of the list shown in FIG. 4.

DETAILED DESCRIPTION OF THE PREFERRED EMBODIMENTS

The information processing method of the present invention is a method for detecting redundant circuits in which RTL is first hierarchically arranged statement by statement, optimized, and then converted to a net list, following which redundant fault sites are detected from the net list, and redundant circuits that include redundant fault sites then displayed.

Figure 2:
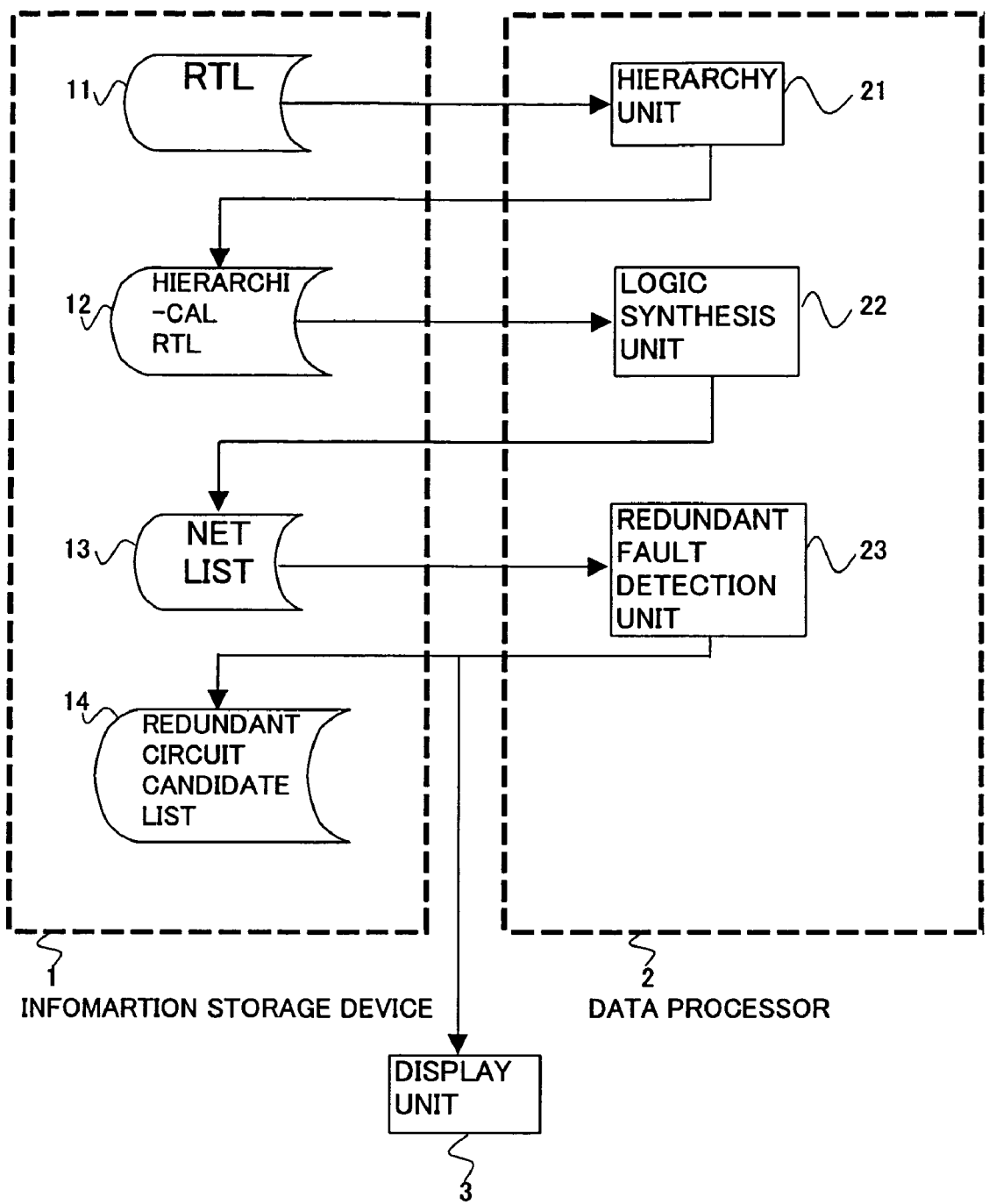
FIG. 2 is a block diagram showing an example of the configuration of the information processing system of the present invention.

FIG. 2 is a block diagram showing an example of the configuration of the information processing system according to the present working example. As shown in FIG. 2, the information processing system is a configuration that includes: information storage device 1, data processor 2, and display unit 3 such as a display device.

Information storage device 1 stores: RTL 11, hierarchical RTL 12, net list 13, and redundant circuit candidate list 14.

RTL 11 is circuit operation information in which circuit operations are described by an HDL such as Verilog-HDL. In the present working example, Verilog-HDL is used in the hardware description language.

Hierarchical RTL 12 is produced by hierarchically arranging RTL 11 statement by statement. In hierarchical RTL 12, the block names of the circuit blocks, in which the operations of unit circuits are defined by module syntax, include the module names, signal names, and line numbers of corresponding RTL 11.

Net list 13 is a circuit pattern that is produced as a result of a logic synthesis and optimization of hierarchical RTL 12 by data processor 2. Redundant circuit candidate list 14 is a list of redundant circuit candidates that have been detected by data processor 2.

Information storage device 1 stores a library (not shown) for substituting the operation of circuits that is described in RTL with circuit patterns during logic synthesis, but as the library is similar to the prior art, a detailed explanation of the library is here omitted.

Data processor 2 includes: hierarchy unit 21 for hierarchically arranging RTL 11; logic synthesis unit 22 for performing a logic synthesis of hierarchical RTL 12 and arranging in net list 13; and redundant fault detection unit 23 for detecting redundant fault sites from net list 13. In addition, data processor 2 is provided with a CPU (Central Processing Unit) for executing prescribed processing of each of the above-described parts in accordance with a program; and a memory for storing programs.

Hierarchy unit 21 reads the RTL description, hierarchically arranges the RTL description statement by statement, and stores the hierarchical RTL 12 in information storage device 1. When hierarchically arranging the RTL, module names, signal names, and line numbers are conferred to block names to maintain a correspondence with original RTL 11.

Logic synthesis unit 22 maintains the hierarchy without change, and converts hierarchical RTL 12 to net list 13 that is the logical equivalent. Details of this conversion method are described in L. Stok et al.: "Booledozer: Logic synthesis for ASICs," (USA) *IBM Journal of Research and Development*, Vol. 40, No. 4, pp. 407-430, July 1996. At this time, logic optimization relating to delay and area is executed. In the present working example, all circuits including even redundant circuits are hierarchically arranged, and because logic synthesis unit 22 does not pass over the hierarchy in the optimization process, redundant circuits are not deleted by the execution of optimization.

Redundant fault detection unit 23 reads net list 13, detects redundant fault sites, reforms statements that include redundant fault sites, produces redundant circuit candidate list 14, and stores this list in information storage device 1. Redundant circuit candidate list 14 is then displayed on display unit 3.

Explanation next regards the operation of the information processing system of the above-described configuration. In this case, RTL 11 is description such as shown in FIG. 1.

Figure 3:
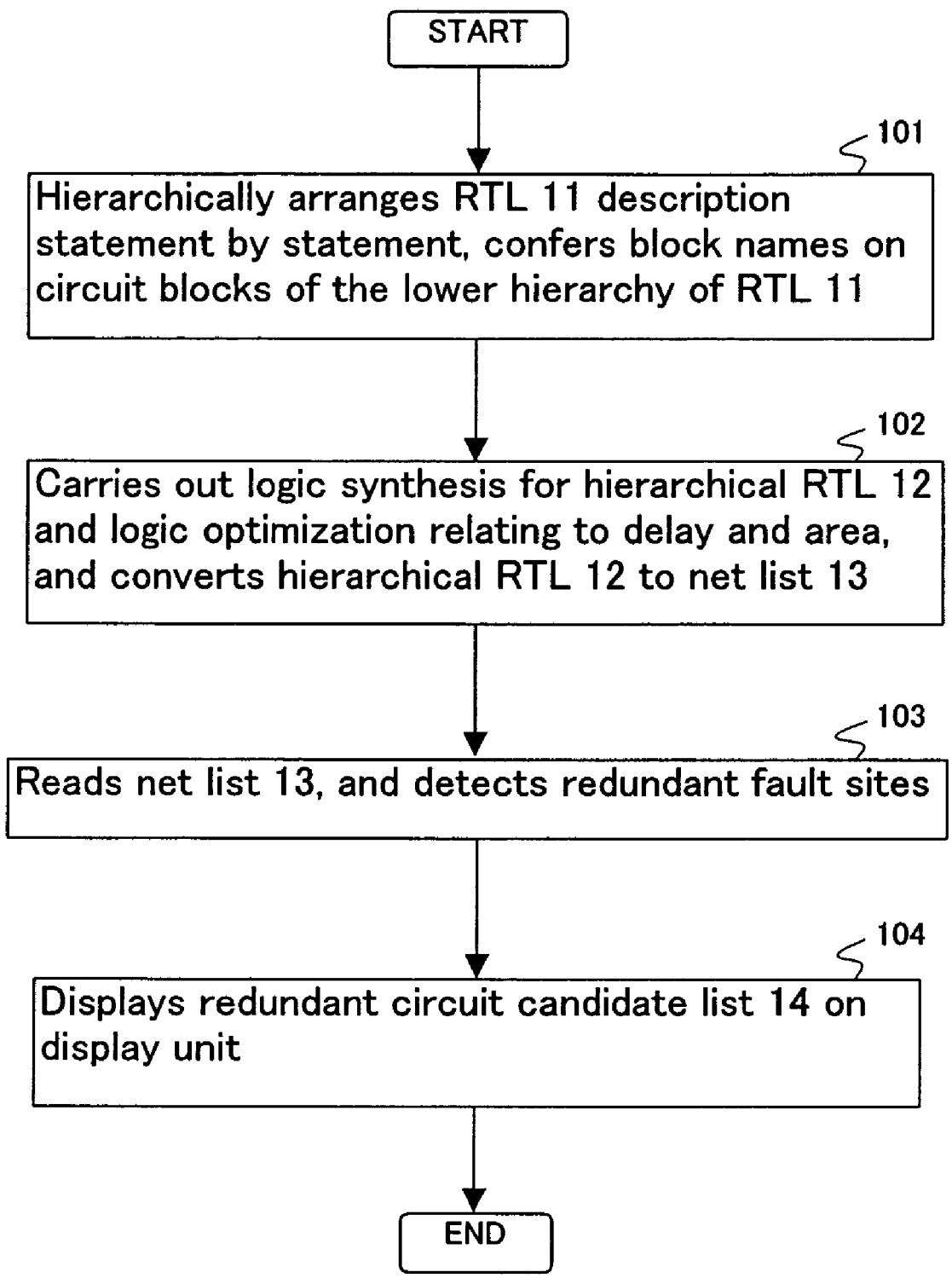
FIG. 3 is a flow chart showing the operational procedures of the information processing system of the present invention.

FIG. 3 is a flow chart showing the operational procedures of the information processing system.

When an operator applies the input of instructions indicating conversion of RTL 11 to net list 13, hierarchy unit 21 reads RTL 11, and supplies as output hierarchical RTL 12 in which RTL 11 has been hierarchically arranged statement by statement (Step 101). FIG. 4 shows the lower hierarchy of RTL that is shown in FIG. 1.

As shown in FIG. 4, the module names of RTL 11 are conferred to the block names of circuit blocks that are to be the newly produced lower module, and the left-side signal names and row numbers of the corresponding RTL 11 formula are conferred to instance names. For example, "TEST_S0_5 (S0, A, B);" corresponds to the continued assignment statement "assign S0=~A & ~B;" of RTL 11, and the left-side signal name "S0" and row number "5" are conferred. Correspondence with the original RTL 11 is thus facilitated.

FIG. 5 shows the lower hierarchy of the hierarchical RTL shown in FIG. 4. As shown in FIG. 5, the module definition syntax is provided corresponding to the module name that is shown in FIG. 4. A and B are defined as pin names in the port declarative statement of the module definition syntax. Further, the module that is relevant to the value of "DOUT" is different from the module that is relevant to the value of "CHECK." As a result, even if a redundant fault site is contained in the cell that corresponds to the statement "assign CHECK=DOUT & ECHK", the module is passed over and optimization is not carried out.

Following Step 101, logic synthesis unit 22 carries out logic synthesis and optimization for hierarchical RTL 12, and converts hierarchical RTL 12 to net list 13 that is the logical equivalent (Step 102). In this logic synthesis, the hierarchy is maintained unchanged and optimization is carried out for delay and area. In the process of this logic synthesis, the hierarchy is maintained, and there is consequently no loss of redundant fault sites that were eliminated when logic synthesis was carried out according to the procedures of the prior art. In addition, information that corresponds to RTL 11 is contained in the block names, and the statement of RTL 11 that generates each cell in net list 13 can therefore be understood.

In net list 13, cells are configured below the hierarchy. Table 1 is an example showing a list of cells. "TEST_DOUT_10" and "TEST_CHECK_19" are block names, and U1, U2, U3, and U8 are instance names of the cells. In addition, although a multiplicity of cells exists beyond the examples shown below, the description of these cells is here omitted.

TABLE 1

—
TEST_DOUT_10/U1
TEST_DOUT_10/U2
TEST_DOUT_10/U3

TABLE 1-continued

—
—
TEST_CHECK_19/U8
—
—

Redundant fault detection unit 23 then reads net list 13, examines whether changes occur in output due to the occurrence or absence of a stuck-at fault in the input signal line for each cell, and detects the absence of change in output as a redundant fault site (Step 103). In this case, redundant fault detection unit 23 determines that a redundant fault site exists in the cell that corresponds to the statement "assign CHECK=DOUT & ECHK" of the module of "TEST_CHECK_19" shown in FIG. 5. In addition, a redundant fault site is determined to be present in the cell of block name "TEST_DOUT_10" that is relevant to this statement. Table 2 is a list showing an example of these detection results. A and B are pin names.

TABLE 2

TEST_DOUT_10/U1/A
TEST_DOUT_10/U2/A
TEST_DOUT_10/U2/B
TEST_CHECK_19/U8/A

Redundant fault detection unit 23 next deletes cell names and pin names from each statement of this list to leave only block names. When a plurality of the same block name occurs, only one is left. These results are then displayed as redundant circuit candidate list 14 on display unit 3 (Step 104). Redundant circuit candidate list 14 is as shown in Table 3 shown below:

TABLE 3

TEST_DOUT_10
TEST_CHECK_19

The designer is then able to specify redundant circuits that are to be provided for reliability from the block names of redundant circuit candidate list 14 that is thus displayed in display unit 3.

In the present invention, when performing the logic synthesis from RTL to a net list, a candidate list of redundant circuits is displayed without deleting redundant circuits. A list of redundant circuits that have been intentionally assembled by the designer is detected, and redundant circuits that are to be protected from optimization can therefore be easily specified. As a result, the designer can look at the block names of the candidate list and leave only the redundant circuits that are to be provided for reliability. Accordingly, the designer need not find all redundant circuits that are for reliability and carry out processes for protecting these redundant circuits from optimization before converting from RTL to a net list, and the burden upon the designer is therefore greatly eased.

In the present working example, a configuration was adopted in which hierarchy unit 21 and logic synthesis unit 22 were realized as separate components, but hierarchy unit 21 may be combined with logic synthesis unit 22 and a mode may be added for hierarchically arranging all statements in logic synthesis unit 22.

In addition, although explanation in the present working example regarded an information processing system having information storage device 1, data processor 2, and display unit 3, an information processor having a storage unit, a data processor, and a display unit may also be used.

Although explanation regarded a case of using Verilog-HDL in the hardware description language, another language such as V (Very High Speed Integrated Circuit) HDL may be employed.

Finally, the present invention may also be applied to a program for causing a computer to execute the information processing method of the present invention.

While a preferred embodiment of the present invention has been described using specific terms, such description is for illustrative purposes only, and it is to be understood that changes and variations may be made without departing from the spirit or scope of the following claims.

What is claimed is:

1. An information processing method for detecting redundant circuits, said information processing method comprising:
    hierarchically arranging statement by statement circuit operation information in which the operation of circuits is described using a hardware description language that is stored in a storage unit;
    referring to a library and performing a logic synthesis of said circuit operation information that has been hierarchically arranged;
    converting the hierarchal circuits operation information to a net list;
    detecting redundant fault sites that are sites that are logically redundant from said net list; and
    displaying information that shows said redundant circuits that contain said redundant fault sites.

2. An information processing method according to claim 1, further comprising conferring different block names for each circuit block in which operations of unit circuits are described, when hierarchically arranging said circuit operation information,
    wherein said information showing said redundant circuits comprises said block names of circuit blocks that contain said redundant fault sites.

3. An information processor, comprising:
    a storage unit for storing circuit operation information in which operations of circuits are described using a hardware description language and a library for performing a logic synthesis of said circuit operation information and converting to a net list that comprises information of circuit patterns;
    a display unit for displaying information showing redundant circuits; and
    a data processor for hierarchically arranging statement by statement said circuit operation information that is stored in said storage unit, and then referring to said library, performing a logic synthesis of the hierarchically arranged circuit operation information and converting to a net list, detecting redundant fault sites that are logically redundant sites from said net list, and displaying on said display unit information that shows said redundant circuits that include the redundant fault sites.

4. An information processor according to claim 3, wherein said data processor, when hierarchically arranging said circuit operation information, confers different block names to each circuit block in which the operations of unit circuits are described, and wherein said information showing said redundant circuits comprises said block names of circuit blocks that contain said redundant fault sites.

5. An information processor according to claim 4, wherein operations of the circuit blocks are defined by a module syntax.

6. An information processor according to claim 4, wherein the block names comprise a module name, signal name, and line numbers of a corresponding register transfer level.

7. An information processor according to claim 4, wherein module names, signal names, and line numbers are conferred to the block names to maintain a correspondence with the original register transfer level.

8. An information processor according to claim 3, wherein the circuit operation information comprises circuit operations described by a hardware designation language.

9. An information processor according to claim 3, wherein the display unit information comprises a list of redundant circuits that are not to be deleted.

10. An information processor according to claim 3, wherein the logic synthesis maintains an unchanged hierarchy and optimization is carried out for delay and area.

11. An information processor according to claim 3, further comprising a redundant fault detection unit configured to determine whether changes in output are due to an occurrence or absence at a stuck-at fault failure in an input signal line for each circuit and to detect an absence of change in output as a redundant fault site.

12. An information processor according to claim 11, wherein the redundant fault detection unit deletes cell names and pin names from each statement of the net list to leave only block names as a redundant circuit candidate list.

13. An information processor according to claim 3, wherein the hierarchically arranged circuit operation information comprises redundant circuit information.

14. An information processor according to claim 3, wherein in the logic synthesis, the data processor maintains the hierarchy to preserve redundant fault sites.

15. A computer readable medium comprising a program for causing a computer to detect redundant circuits said program causing said computer to execute processes comprising the steps of:
    hierarchically arranging statement by statement circuit operation information in which the operation of circuits is described using a hardware description language that is stored in a storage unit;
    referring to a library;
    performing a logic synthesis of hierarchically arranged said circuit operation information;
    converting the hierarchal circuits operation information to a net list;
    detecting redundant fault sites that are sites that are logically redundant from said net list; and
    displaying information that shows said redundant circuits that contain said redundant fault sites.

16. The computer readable medium of claim 15, further comprising the step of conferring different block names to each circuit block in which operations of unit circuits are described, when hierarchically arranging said circuit operation information,
    wherein said information showing said redundant circuits comprises said block names of circuit blocks that contain said redundant fault sites.

* * * * *